United States Patent
Wei et al.

(10) Patent No.: US 7,033,906 B2
(45) Date of Patent: Apr. 25, 2006

(54) AIRDOME ENCLOSURE FOR COMPONENTS

(76) Inventors: John Shi Sun Wei, 11143 Wilkinson Ave., Cupertino, CA (US) 94014; Ray Myron Parkhurst, 39120 Arg naut #273, Fremont, CA (US) 94538; Michael James Jennison, 1960 Snowy Owl Dr., Broomfield, CO (US) 80020; Philip Gene Nikkel, 3201 Cactus Ct., Loveland, CO (US) 80537

( * ) Notice: Subject to any disclaimer, the term of this patent is extended or adjusted under 35 U.S.C. 154(b) by 78 days.

(21) Appl. No.: 10/769,935

(22) Filed: Feb. 2, 2004

(65) Prior Publication Data

US 2005/0170605 A1   Aug. 4, 2005

(51) Int. Cl.
*H01L 21/76* (2006.01)

(52) U.S. Cl. .......................... 438/411; 438/421; 438/619
(58) Field of Classification Search ................ 438/411, 438/412, 421, 422, 619
See application file for complete search history.

(56) References Cited

U.S. PATENT DOCUMENTS

| | | | | |
|---|---|---|---|---|
| 5,171,713 A | * | 12/1992 | Matthews | 438/31 |
| 5,593,926 A | * | 1/1997 | Fujihira | 438/114 |
| 5,698,462 A | * | 12/1997 | Sasaki | 438/167 |
| 5,900,668 A | * | 5/1999 | Wollesen | 257/522 |
| 5,953,626 A | * | 9/1999 | Hause et al. | 438/622 |
| 6,091,149 A | * | 7/2000 | Hause et al. | 257/758 |
| 6,184,121 B1 | * | 2/2001 | Buchwalter et al. | 438/622 |
| 6,617,686 B1 | * | 9/2003 | Davies | 257/725 |
| 6,780,663 B1 | * | 8/2004 | Park et al. | 438/52 |
| 2003/0104688 A1 | * | 6/2003 | Wade | 438/622 |

* cited by examiner

*Primary Examiner*—Nathan J. Flynn
*Assistant Examiner*—Lex H. Malsawma

(57) ABSTRACT

A component having an airdome enclosure that protects the component from its external environment. An airdome enclosure according to the present techniques avoids the high costs of employing special materials and/or specialized process steps in the manufacture of a component. An electronic component according to the present techniques includes a set of substructures formed on a substrate and an airdome enclosure over the substructures that protects the substructures and that hinders the formation of parasitic capacitances among the substructures.

19 Claims, 4 Drawing Sheets

AIRDOME ENCLOSURE FOR COMPONENTS

BACKGROUND

A variety of components, e.g. electronic components and mechanical components, may include a coating of material for protecting the component from its external environment. For example, an electronic component may be applied with a plastic molding material during manufacture that provides moisture protection for the electronic component as well as provide electrical isolation among subcomponents of the electronic component.

A protective coating material on an electronic component may possess dielectric properties that may adversely affect the operation of the electronic component. For example, a plastic molding material may have a relatively high dielectric constant. A material with a relatively high dielectric constant may cause the formation of relatively high parasitic capacitances among the subcomponents of an electronic component. Unfortunately, high levels of parasitic capacitances among the subcomponents of an electronic component may adversely affect the operation of the electronic component. For example, parasitic capacitances may adversely affect the frequency response of an electronic component.

One prior technique for minimizing the undesirable parasitic capacitances in an electronic component caused by a protective coating is to employ a coating material having a relatively low dielectric constant. For example, composite materials or porous plastic materials having a relatively low dielectric constant may be employed to protect an electronic component. Unfortunately, composite materials and porous plastic materials may increase the costs of manufacturing an electronic component by imposing additional steps on the manufacturing process.

SUMMARY OF THE INVENTION

A component is disclosed having an airdome enclosure that protects the component from its external environment. An airdome enclosure according to the present techniques avoids the high costs of employing special materials and/or specialized process steps in the manufacture of a component.

An electronic component according to the present technique includes a set of substructures for the electronic component formed on a substrate and an airdome enclosure over the substructures that protects the electronic component. The airdome enclosure includes air spaces that isolate the substructures while hindering the formation of parasitic capacitances among the substructures.

Other features and advantages of the present invention will be apparent from the detailed description that follows.

BRIEF DESCRIPTION OF THE DRAWINGS

The present invention is described with respect to particular exemplary embodiments thereof and reference is accordingly made to the drawings in which.

DETAILED DESCRIPTION

Figure 1A:
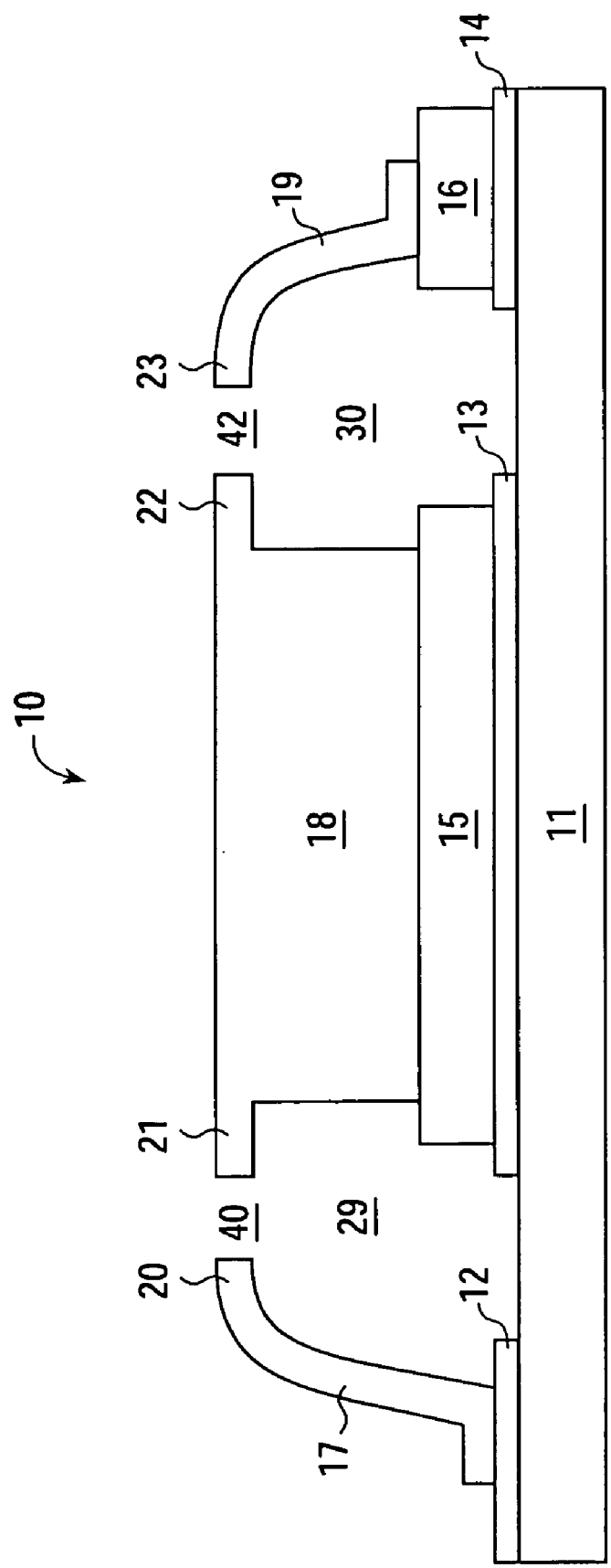
FIG. 1a–1b illustrate the formation of an electronic component that includes an airdome enclosure according to the present teachings.
Figure 1B:
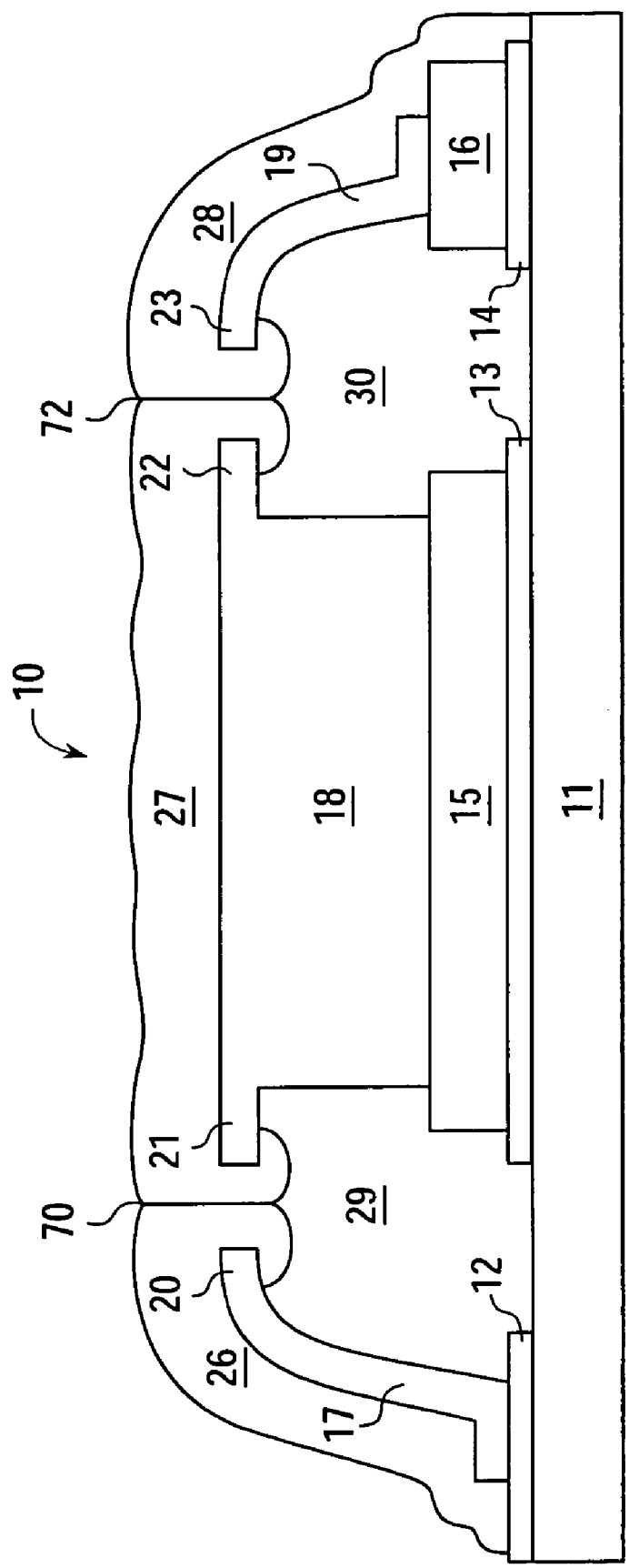

FIGS. 1a–1b illustrate the formation of an electronic component 10 that includes an airdome enclosure according to the present teachings. The airdome enclosure of the electronic component 10 protects the electronic component 10 and forms a set of air spaces 29 and 30 that provide electrical isolation among the subcomponents of the electronic component 10. The relatively low dielectric constant associated with the air in the air spaces 29 and 30 hinder the formation of undesirable parasitic capacitances among the subcomponents of the electronic component 10.

The electronic component 10 is formed onto a substrate 11. Example materials for the substrate 11 include silicon and gallium-arsenide. Other substrate materials include metal, plastic, circuit board materials, organic film, etc.

The electronic component 10 includes a series of layers deposited onto the substrate 11. The layer materials deposited onto the substrate 11 may be selected and patterned into the particular subcomponents for the electronic component 10. For example, the layers may be deposited and patterned to form transistor subcomponents, capacitor subcomponents, resistor subcomponents, etc., depending on the particular design of the electronic component 10. The materials of these layers may include any combination of metal and dielectric materials.

In one embodiment, the series of layers deposited onto the substrate 11 include a first, a second, and a third metal layer. Example methods for forming the metal layers include evaporation, sputtering, and plating.

The first metal layer is patterned into a set of metal structures 12, 13, and 14. The second metal layer is patterned into a set of metal structures 15 and 16.

A dielectric material is deposited over the metal structures 12–16 and patterned to form what will be the air spaces 29 and 30 and then the third metal layer is deposited over the dielectric material that covers the metal structures 12–16. The third metal layer is then patterned into a set of metal structures 17, 18, and 19. The dielectric material is then removed to reveal the air spaces 29 and 30. The dielectric material deposited over the metal structures 12–16 and patterned to form what will be the air spaces 29 and 30 may be a photo-resist or some other type of dielectric material.

The patterning of the third metal layer forms a ledge 20 on the structure 17 and a ledge 21 on the structure 18 with an air gap 40 in between the ledges 20 and 21. The patterning of the third metal layer also forms a ledge 22 on the structure 18 and a ledge 23 on the structure 19 with an air gap 42 in between the ledges 22 and 23. The air gaps 40–42 may be formed to the most narrow possible gap width given the process technology used to form the electronic component 10. In one embodiment, the width of each air gap 40–42 is between 1 and 3 microns.

A dielectric overcoat is then deposited onto the electronic component 10 to form a set of dielectric films 26–28. The dielectric films 26–28 form a seal 70 in the air gap 40 and a seal 72 in the air gap 42 but do not fill in the air spaces 29–30. Example materials for the dielectric overcoat include silicon-dioxide, silicon-nitride, or a combination of silicon-dioxide and silicon-nitride, a plastic molding compound, or an organic molding compound.

The dielectric overcoat may be deposited using a dry process in which a gas reaction is used to form the dielectric material. The dielectric overcoat may be deposited using a wet process in which a liquid form of glass is applied and then heated. The dielectric overcoat may be formed by depositing an organic film followed by a curing step.

The width and/or shapes of the air gaps 40–42 may be selected to allow the dielectric overcoat to form the seals 70–72 while preventing the dielectric overcoat from entering and filling the air spaces 29 and 30. The widths and/or shapes of the air gaps 40–42 may be selected in response to the viscosity of the dielectric overcoat during deposition and/or the process temperature during deposition. The air spaces 29 and 30 may be filled with a air or low pressure gases during the deposition of the dielectric overcoat.

Figure 2:
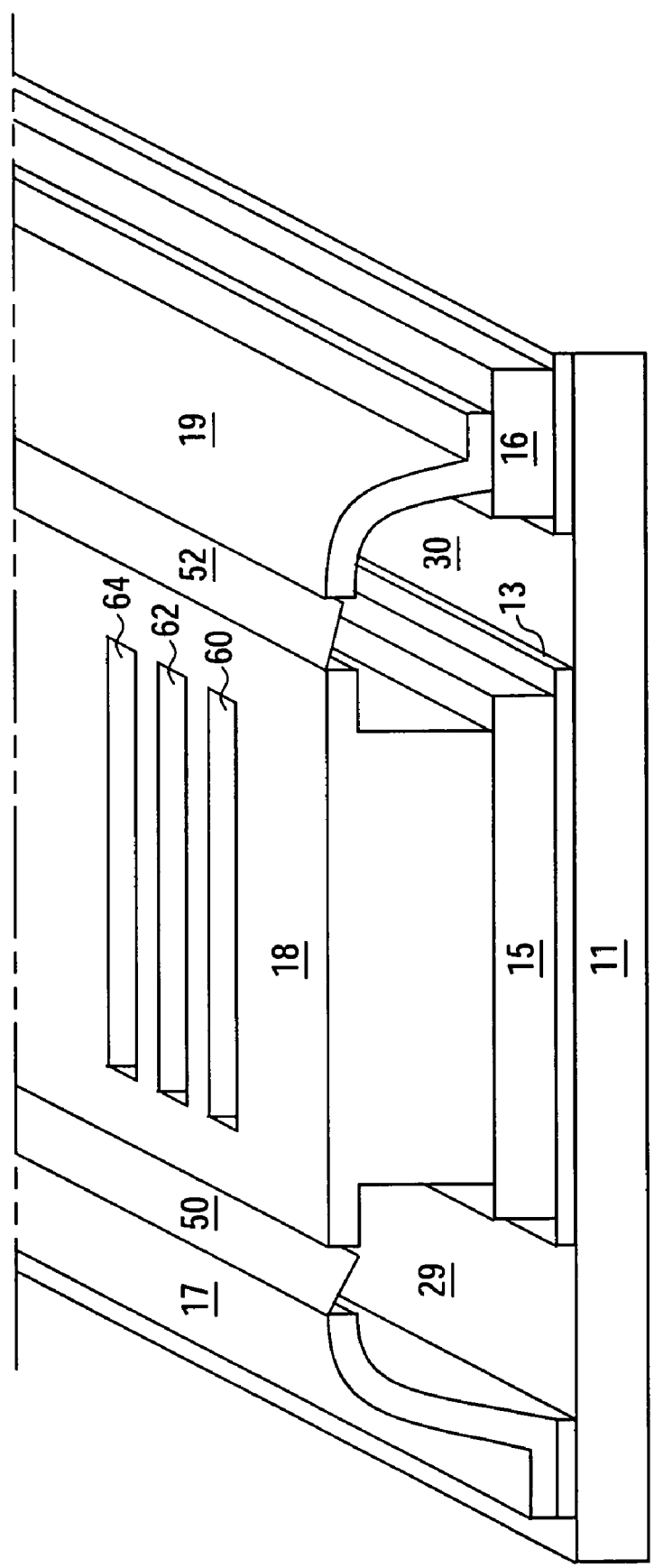
FIG. 2 is a cut-away perspective view of an electronic component that shows a set of dielectric regions that form seals in the gaps.

FIG. 2 is a cut-away perspective view of the electronic component 10 that shows a set of dielectric regions 50–52 of the dielectric overcoat that form seals in the air gaps 40–42. This view also shows a set of dielectric regions 60–64 that form seals in openings on the top of the metal structure 18. The openings on the top of the metal structure 18 may be formed during cleanout of process material.

Figure 3:
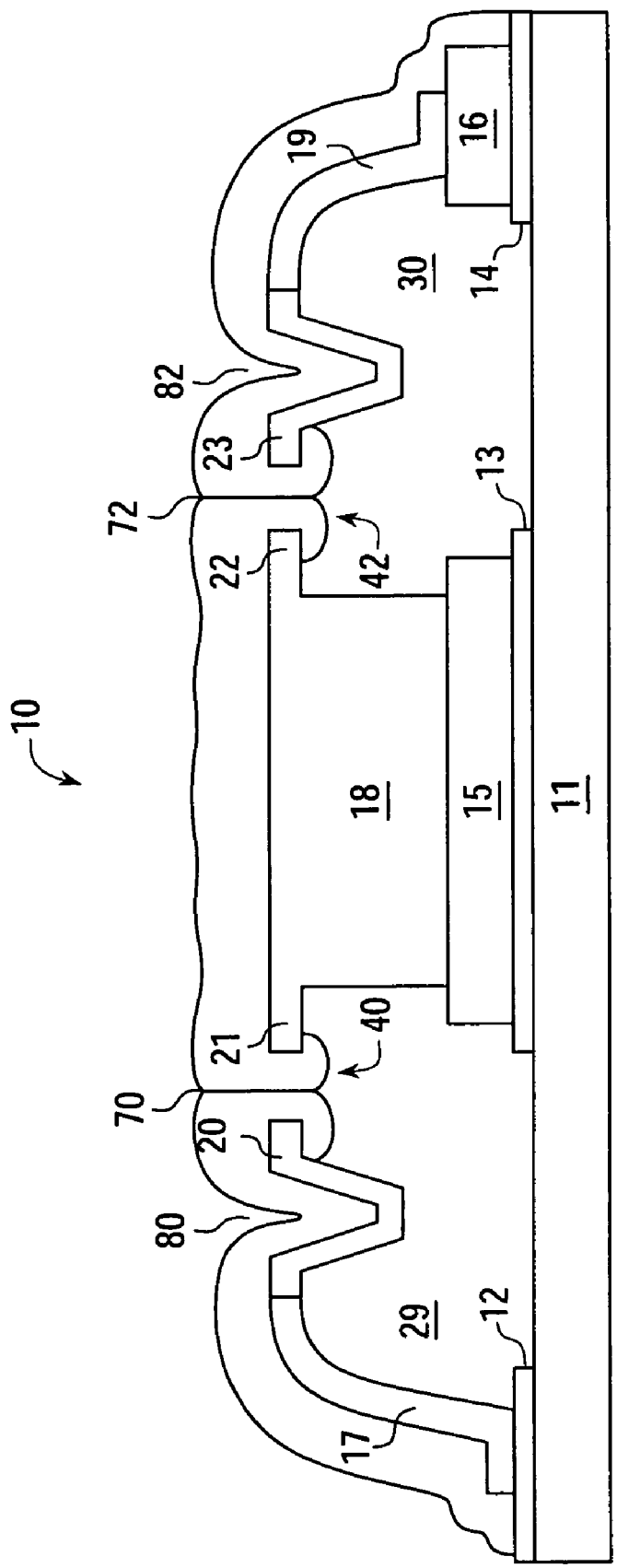
FIG. 3 shows an embodiment that includes a pair of valleys formed in a top substructure that impede movement of dielectric material into the air spaces.

FIG. 3 shows an embodiment in which the third metal layer includes a pair of valleys 80–82. The valleys 80–82 are shaped so as to impede the movement of dielectric material through the air gaps 40–42 into the air spaces 29 and 30 during formation of the dielectric overcoat. As before, the dielectric material underneath the third metal layer is removed after patterning of the air gaps 40–42 to reveal the air spaces 29 and 30.

The valleys 80–82 may be shaped by shaping the dielectric material, e.g. a photo-resist, underneath the third metal layer. For example, the V-shaped dips of the valleys 80–82 may be formed with a photo-masking step and exposure of the photo-resist. Alternatively, a single photo-mask may be employed with specially designed aperture patterns using OPC (Optical Proximity Correction) algorithms. If a dielectric material is used underneath the third metal layer then that dielectric material may be subjected to a second photo-masking and etching to produce the V-shaped dips for the valleys 80–82.

An airdome enclosure according to the present techniques may be used in any type of electronic component including active components and passive components. In addition, an airdome enclosure according to the present techniques may be used for any component, electronic or otherwise, that may benefit from the protection provided from an external environment.

The foregoing detailed description of the present invention is provided for the purposes of illustration and is not intended to be exhaustive or to limit the invention to the precise embodiment disclosed. Accordingly, the scope of the present invention is defined by the appended claims.

What is claimed is:

1. A method for forming a component, comprising:
   forming a set of substructures for the component;
   forming an airdome structure that encloses the substructures and that provides a set of air spaces for providing isolation among the substructures wherein forming an airdome structure includes forming an overcoat for the airdome structure by filling the air spaces with a gas while depositing the overcoat.

2. The method of claim 1, wherein forming an airdome structure includes forming the air spaces in the airdome structure.

3. The method of claim 2, wherein forming the air spaces includes:
   depositing a layer of dielectric material;
   forming a top substructure onto the layer of dielectric material;
   forming a set of gaps in the top substructure;
   removing the layer of dielectric material underneath the top substructure.

4. The method of claim 3, wherein forming an overcoat includes depositing the overcoat on the top substructure such that the overcoat seals the gaps and encloses the air spaces.

5. The method of claim 4, wherein depositing the overcoat includes depositing a dielectric material.

6. The method of claim 4, wherein depositing the overcoat includes depositing a plastic material.

7. The method of claim 4, wherein depositing the overcoat includes depositing an organic material.

8. The method of claim 4, wherein forming a top substructure includes shaping the top substructure to impede the overcoat from entering the air spaces.

9. The method of claim 8, wherein shaping the top substructure includes shaping the layer of dielectric material.

10. A method for forming a component, comprising:
    forming a set of substructures for the component;
    forming an airdome structure that encloses the substructures and that provides a set of air spaces for providing isolation among the substructures wherein forming an airdome structure includes forming a set of valleys in the airdome structure and depositing an overcoat on the airdome structure such that the valleys impede the overcoat from entering the air spaces.

11. The method of claim 10, wherein forming an airdome structure comprises:
    depositing a layer of dielectric material;
    forming a top substructure onto the layer of dielectric material;
    forming a set of gaps in the top substructure;
    removing the layer of dielectric material underneath the top substructure.

12. The method of claim 11, wherein forming a set of valleys in the airdome structure includes forming a set of V-shaped valleys in the top substructure.

13. The method of claim 12, wherein forming a set of V-shaped valleys in the top substructure includes shaping the layer of dielectric material.

14. The method of claim 11, wherein depositing an overcoat on the airdome structure includes depositing the overcoat on the top substructure such that the overcoat seals the gaps and encloses the air spaces.

15. The method of claim 11, wherein forming a set of gaps includes forming the gaps in response to a viscosity of the overcoat.

16. The method of claim 11, wherein forming a set of gaps includes selecting a shape of the gaps to prevent the overcoat from filling the air spaces.

17. The method of claim 10, wherein depositing an overcoat includes depositing a dielectric material.

18. The method of claim 10, wherein depositing an overcoat includes depositing a plastic material.

19. The method of claim 10, wherein depositing an overcoat includes depositing an organic material.

* * * * *